United States Patent
Yoshioka et al.

(10) Patent No.: US 10,539,626 B2
(45) Date of Patent: Jan. 21, 2020

(54) ENERGY STORAGE APPARATUS, ENERGY STORAGE SYSTEM, AND METHOD OF DETERMINING STATE OF ENERGY STORAGE APPARATUS

(71) Applicant: GS Yuasa International Ltd., Kyoto-shi (JP)

(72) Inventors: Takatomo Yoshioka, Kyoto (JP); Katsuhisa Michinaga, Kyoto (JP); Takumi Kimura, Kyoto (JP)

(73) Assignee: GS YUASA INTERNATIONAL LTD., Kyoto-Shi, Kyoto (JP)

( * ) Notice: Subject to any disclaimer, the term of this patent is extended or adjusted under 35 U.S.C. 154(b) by 199 days.

(21) Appl. No.: 15/701,058

(22) Filed: Sep. 11, 2017

(65) Prior Publication Data

US 2018/0095137 A1 Apr. 5, 2018

(30) Foreign Application Priority Data

Sep. 30, 2016 (JP) .................................. 2016-193617

(51) Int. Cl.
| | |
|---|---|
| *H01M 10/46* | (2006.01) |
| *G01R 31/3842* | (2019.01) |
| *H02J 7/00* | (2006.01) |
| *G01R 15/20* | (2006.01) |

(52) U.S. Cl.
CPC ........ *G01R 31/3842* (2019.01); *H02J 7/0026* (2013.01); *G01R 15/202* (2013.01)

(58) Field of Classification Search
CPC ...... H02J 7/0018; H02J 7/0019; H02J 7/0026; H02J 7/0021

USPC ......... 320/107, 116, 117, 118, 119, 132, 149
See application file for complete search history.

(56) References Cited

U.S. PATENT DOCUMENTS

| | | | |
|---|---|---|---|
| 7,019,489 B2 * | 3/2006 | Nakada ................. | H02J 7/0016 320/104 |
| 2002/0084785 A1 | 7/2002 | Park | |
| 2004/0001996 A1 | 1/2004 | Sugimoto | |
| 2005/0212486 A1 | 9/2005 | Nakada | |
| 2006/0208708 A1 | 9/2006 | Ishishita | |
| 2010/0085014 A1 | 4/2010 | Saeki et al. | |
| 2012/0175953 A1 | 7/2012 | Ohkawa et al. | |

(Continued)

FOREIGN PATENT DOCUMENTS

| | | |
|---|---|---|
| EP | 2 428 809 A2 | 3/2012 |
| JP | H 10-123225 A | 5/1998 |

(Continued)

OTHER PUBLICATIONS

Extended European Search Report dated Jan. 30, 2018 in corresponding European Application No. 17188107.1-1022.

*Primary Examiner* — Edward Tso
(74) *Attorney, Agent, or Firm* — McGinn IP Law Group, PLLC

(57) ABSTRACT

An energy storage apparatus includes a plurality of energy storage devices connected in series, a voltage detection unit configured to detect voltage of each of the energy storage devices, and a monitoring unit configured to monitor the plurality of energy storage devices. The monitoring unit determines a state of the energy storage apparatus in accordance with average cell voltage or an average SOC of the plurality of energy storage devices and minimum cell voltage of the plurality of energy storage devices.

14 Claims, 8 Drawing Sheets

(56) References Cited

U.S. PATENT DOCUMENTS

| | | | | |
|---|---|---|---|---|
| 2012/0274281 A1* | 11/2012 | Kim | .................. | H02J 7/0021 |
| | | | | 320/112 |
| 2014/0232413 A1 | 8/2014 | Kitahara et al. | | |
| 2016/0233697 A1* | 8/2016 | Ozawa | ................ | H02J 7/0016 |

FOREIGN PATENT DOCUMENTS

| | | |
|---|---|---|
| JP | H 11-55865 A | 2/1999 |
| JP | H 11-69798 A | 3/1999 |
| JP | 2000-134805 A | 5/2000 |
| JP | 2000-253569 A | 9/2000 |
| JP | 2002-010511 A | 1/2002 |
| JP | 2002-334726 A | 11/2002 |
| JP | 2004-031120 A | 1/2004 |
| JP | 2006262634 A | 9/2006 |
| JP | 2008-312282 A | 12/2008 |
| JP | 2009-037962 A | 2/2009 |
| JP | 2009-261148 A | 11/2009 |
| JP | 2010-017000 A | 1/2010 |
| JP | 2010-093876 A | 4/2010 |
| JP | 2010-164510 A | 7/2010 |
| JP | 2010-218976 A | 9/2010 |
| JP | 2011-145105 A | 7/2011 |
| JP | 2012-249456 A | 12/2012 |
| JP | 2013-078233 A | 4/2013 |
| JP | 2014-157075 A | 8/2014 |
| JP | 2014-157717 A | 8/2014 |
| JP | 2014-197542 A | 10/2014 |
| JP | 2015-006027 A | 1/2015 |
| JP | 2015-163025 A | 9/2015 |
| JP | 2016-009552 A | 1/2016 |
| JP | 2016-059243 A | 4/2016 |

* cited by examiner

ENERGY STORAGE APPARATUS, ENERGY STORAGE SYSTEM, AND METHOD OF DETERMINING STATE OF ENERGY STORAGE APPARATUS

CROSS-REFERENCE TO RELATED APPLICATIONS

This application is based on Japanese Patent Application No. 2016-193617 filed on Sep. 30, 2016, the entire contents of which are hereby incorporated by reference.

FIELD

The present invention relates to an energy storage apparatus.

BACKGROUND

An unmanned carrier includes an energy storage apparatus configured as a power supply including a plurality of energy storage devices connected in series. Such an energy storage apparatus is configured to, for security purposes, monitor voltage of each of the energy storage devices, determine as being abnormal if minimum cell voltage becomes less than a lower limit value, and actuate a protective apparatus such as a current breaker. See JP 2008-312282 A.

SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The energy storage apparatus configured as described above determines a state of the energy storage apparatus, such as whether or not the energy storage apparatus has abnormality, in accordance with the minimum cell voltage. The energy storage devices, however, have decrease in voltage due to internal resistance. There has been a demand for a measure, because such a method of determining the state of the energy storage apparatus only in accordance with the minimum cell voltage may fail to achieve accurate determination on the state of the energy storage apparatus.

The present invention has been made in view of the above circumstance, and achieves improvement in accuracy of determination on a state of an energy storage apparatus.

The present application discloses an energy storage apparatus including: a plurality of energy storage devices connected in series; a voltage detection unit configured to detect voltage of each of the energy storage devices; and a monitoring unit configured to monitor the plurality of energy storage devices. The monitoring unit determines a state of the energy storage apparatus in accordance with average cell voltage or an average SOC of the plurality of energy storage devices and minimum cell voltage of the plurality of energy storage devices.

A cell indicates a constituent unit of an apparatus including a plurality of energy storage devices, and a single cell corresponds to a single energy storage device.

BRIEF DESCRIPTION OF DRAWINGS

The foregoing and other features of the present invention will become apparent from the following description and drawings of an illustrative embodiment of the invention in which.

DESCRIPTION OF EMBODIMENTS

Figure 1:
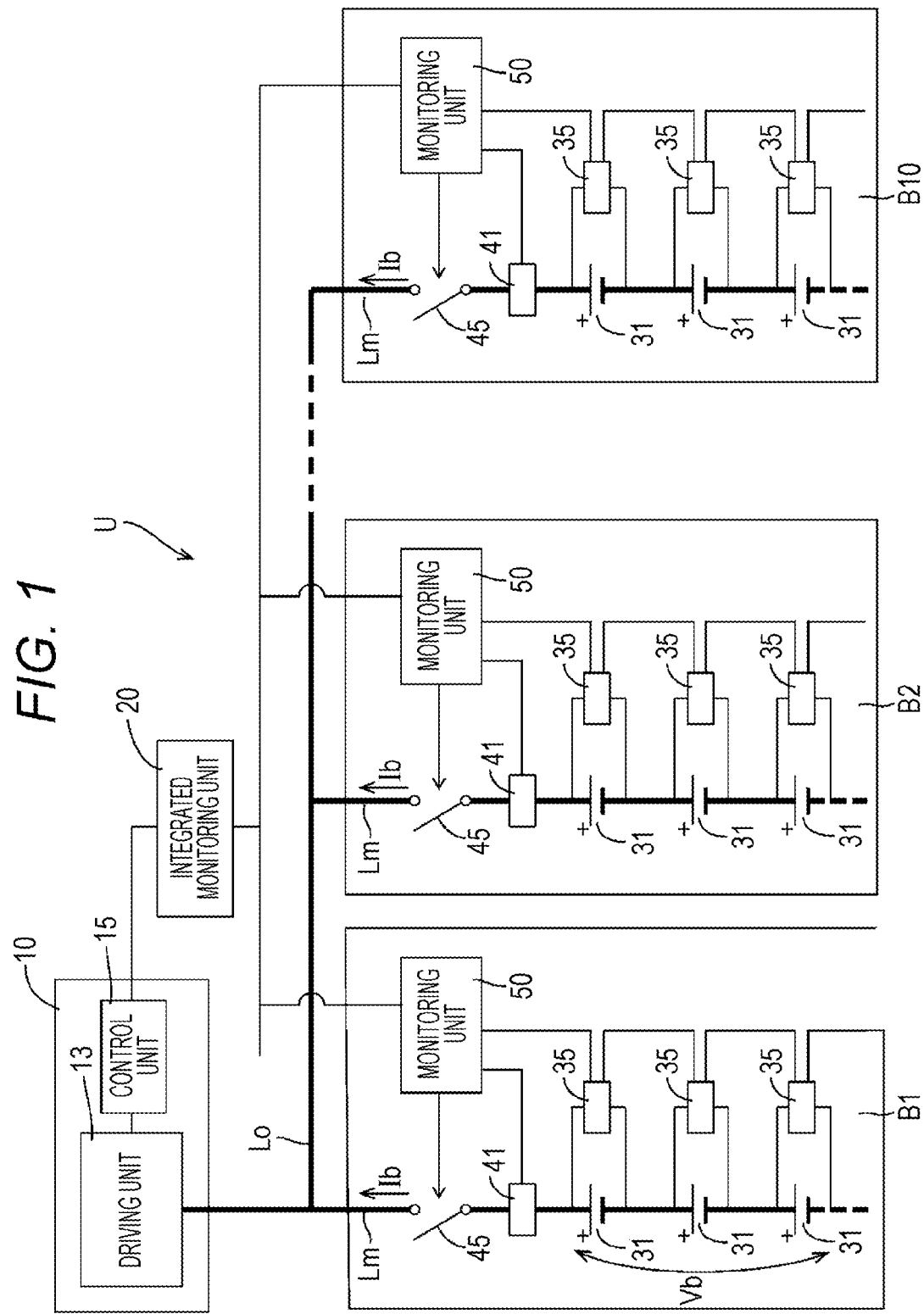
FIG. 1 is a block diagram depicting an electrical configuration of a power supply system according to a first embodiment.

The present application discloses an energy storage apparatus including: a plurality of energy storage devices connected in series; a voltage detection unit configured to detect voltage of each of the energy storage devices; and a monitoring unit configured to monitor the plurality of energy storage devices. The monitoring unit determines a state of the energy storage apparatus in accordance with average cell voltage or an average SOC of the plurality of energy storage devices and minimum cell voltage of the plurality of energy storage devices.

The present application further discloses a multibank energy storage system including a plurality of energy storage apparatuses connected parallelly (in parallel). The energy storage system includes: the plurality of energy storage apparatuses connected parallelly; and an integrated monitoring unit configured to monitor the plurality of energy storage apparatuses. The integrated monitoring unit determines a state of the energy storage system in accordance with the average cell voltage or the average SOC of the energy storage devices of the energy storage system and the minimum cell voltage of the energy storage devices of the energy storage system.

The present application also discloses a method of determining a state of an energy storage apparatus. The energy storage apparatus includes a plurality of energy storage devices connected in series. The method includes determining the state of the energy storage apparatus in accordance with average cell voltage or an average SOC of the plurality of energy storage devices and minimum cell voltage of the plurality of energy storage devices.

The energy storage apparatus disclosed in the present application achieves more accurate determination on the state of the energy storage apparatus in comparison to determination on the state of the energy storage apparatus only in accordance with the minimum cell voltage. The energy storage system and the method of determining the state of the energy storage apparatus disclosed in the present application achieve the same effect.

An energy storage apparatus disclosed in the present embodiment will be summarized initially.

The energy storage apparatus includes: a plurality of energy storage devices connected in series; a voltage detection unit configured to detect voltage of each of the energy storage devices; and a monitoring unit configured to monitor the plurality of energy storage devices. The monitoring unit determines a state of the energy storage apparatus in accordance with average cell voltage or an average SOC of the plurality of energy storage devices and minimum cell voltage of the plurality of energy storage devices.

This configuration achieves more accurate determination on the state of the energy storage apparatus in comparison to determination on the state of the energy storage apparatus only in accordance with the minimum cell voltage of the plurality of energy storage devices.

The monitoring unit may determine whether or not the energy storage apparatus has abnormality in accordance with the minimum cell voltage of the plurality of energy storage devices when the average cell voltage or the average SOC of the plurality of energy storage devices is not less than a threshold.

When an average cell voltage or an average SOC is not less than the threshold and minimum cell voltage is less than an ordinary value, that particular cell is likely to be abnormal. This configuration achieves accurate determination on whether or not the energy storage apparatus has abnormality.

The monitoring unit may compare the minimum cell voltage of the plurality of energy storage devices with a determination value smaller than the threshold when the average cell voltage or the average SOC of the plurality of energy storage devices is not less than the threshold, and may determine that the energy storage apparatus has abnormality when the minimum cell voltage is less than the determination value. With this configuration, the energy storage apparatus is determined as being abnormal if the minimum cell voltage becomes less than the determination value with the average cell voltage or the average SOC being not less than the threshold.

The threshold and the determination value may have a difference therebetween set in accordance with a permissible range of voltage variation of the energy storage device. This configuration achieves higher determination accuracy because the energy storage apparatus is not determined as being abnormal with the voltage variation of the energy storage devices being within the permissible range.

The determination value may be obtained by adding a predetermined margin to a lower limit value of cell voltage of the energy storage device. This configuration enables abnormality determination on the energy storage apparatus before the minimum cell voltage reaches the lower limit value.

The energy storage apparatus may further include: a current breaker configured to break current flowing through the plurality of energy storage devices. The monitoring unit may break the current breaker when the monitoring unit determines that the energy storage apparatus has abnormality. This configuration enables the abnormal energy storage apparatus to be disconnected from the power supply target instrument.

The monitoring unit may determine whether or not to limit discharge current of the energy storage apparatus in accordance with the minimum cell voltage of the plurality of energy storage devices when the average cell voltage or the average SOC of the plurality of energy storage devices is less than the threshold.

When the plurality of energy storage devices has decreased minimum cell voltage with the average cell voltage or the average SOC being less than the threshold, the energy storage apparatus is less likely to be abnormal but the flowing discharge current is likely to exceed an appropriate value. This configuration thus achieves accurate determination on whether or not the discharge current needs to be limited.

The monitoring unit may compare the minimum cell voltage of the plurality of energy storage devices with switching voltage higher than the lower limit value when the average cell voltage or the average SOC of the plurality of energy storage devices is less than the threshold, and may determine that the discharge current of the energy storage apparatus needs to be limited when the minimum cell voltage is not more than the switching voltage and may notify to request a power supply target instrument to execute current limitation processing of limiting the discharge current.

This configuration achieves request for execution of the current limitation processing to reduce the discharge current when the minimum cell voltage reaches the switching voltage, so as to suppress decrease in voltage of the energy storage devices. The minimum cell voltage of the plurality of energy storage devices can thus be kept not less than the lower limit value to allow continuous use of the energy storage apparatus.

The same applies to a multibank energy storage system including the energy storage apparatuses connected parallelly.

<First Embodiment>

The first embodiment of the present invention will now be described with reference to FIGS. 1 to 5.

1. Electrical Configuration of Power Supply System U

FIG. 1 is a block diagram of a power supply system. The power supply system U is applied as a power supply of an unmanned carrier 10 or the like, and includes an integrated monitoring unit 20 and a plurality of battery banks B1 to B10. The power supply system U corresponds to a "multibank power supply system", and the battery banks B1 to B10 each correspond to an "energy storage apparatus".

As depicted in FIG. 1, the plurality of battery banks B1 to B10 is connected parallelly, and is connected to a driving unit (specifically, a motor) 13 of the unmanned carrier 10 via a common current path Lo. The number of the battery banks B connected parallelly is "ten" in the present example.

The battery banks B1 to B10 are structured identically, and each include a plurality of battery modules 31 connected in series, a plurality of module sensors 35, a current sensor 41, a current breaker 45, and an individual monitoring unit 50.

Figure 2:
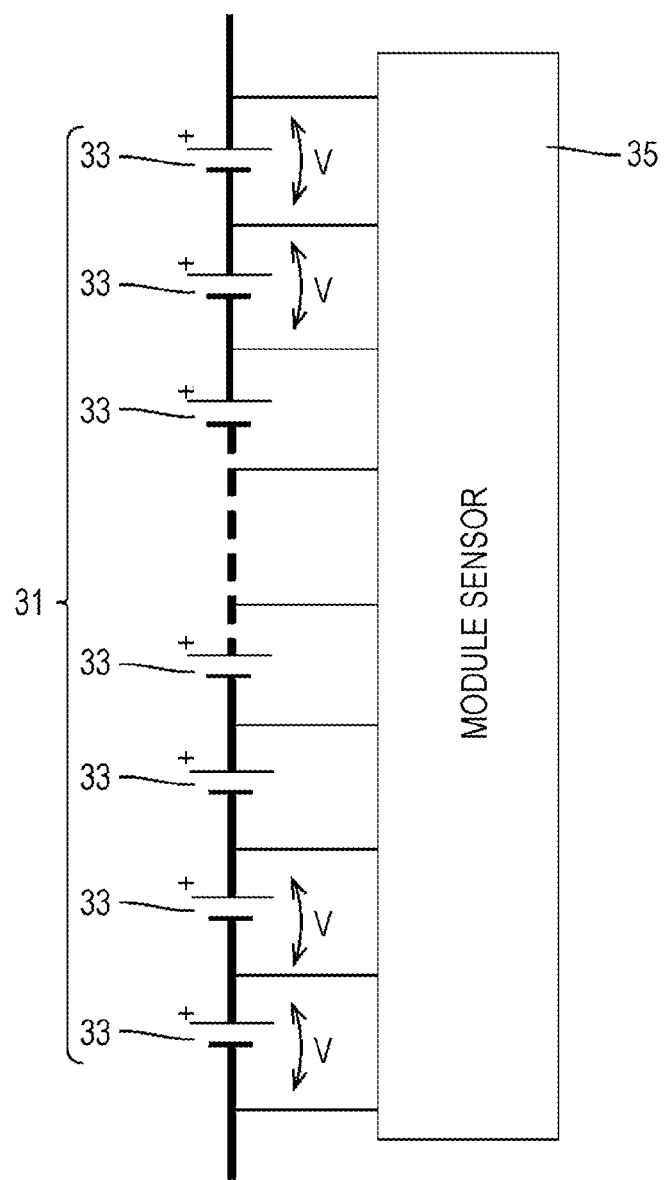
FIG. 2 is a block diagram depicting a configuration of a battery module.

As depicted in FIG. 2, the battery modules 31 each include a plurality of secondary batteries (exemplified by lithium ion secondary batteries) 33 connected in series. The battery modules 31 according to the present example each include twelve secondary batteries 33. There are fifteen battery modules 31 connected in series. Each of the battery banks B thus includes 180 secondary batteries 33 connected in series. The following description will refer to a "cell" indicating a constituent unit of the battery module 31, and a single cell corresponds to a single secondary battery 33.

Each of the module sensors 35 is provided for corresponding one of the battery modules 31, and detects cell voltage V of each of the secondary batteries 33 of the battery module 31. The module sensors 35 further detects temperature of the battery module 31. The module sensors 35 is connected with the individual monitoring unit 50 via a signal line. Cell voltage data on each of the secondary batteries 33 and temperature data on the battery module 31 detected by the module sensor 35 is transmitted to the individual monitoring unit 50. The module sensor 35 corresponds to a "voltage detection unit".

The current sensor 41 is exemplified by a hall sensor. The current sensor 41 is provided on a current path Lm of the battery modules 31 and detects current flowing to/from the battery modules 31. The current sensor 41 is connected to the individual monitoring unit 50 via a signal line. Current data detected by the current sensor 41 is transmitted to the individual monitoring unit 50.

The current breaker 45 is exemplified by a molded case circuit breaker provided on the current path Lm of the battery modules 31. The current breaker 45 opens the current path Lm of the battery modules 31 to break current in response to a command from the individual monitoring unit 50. Actuating the current breaker 45 to break current will hereinafter be expressed as tripping.

The individual monitoring unit 50 includes a central processing unit (CPU) (not depicted) and a memory (not depicted) configured to store various types of information. The individual monitoring unit 50 monitors the state of the battery bank B in accordance with data received from the module sensors 35 and the current sensor 41. The individual monitoring unit 50 monitors the following data items.

<Data Items Monitored by Individual Monitoring Unit 50>

(1) Cell voltage V of each secondary battery 33
(2) Total voltage Vb of plurality of battery modules 31
(3) Temperature T of each battery module 31
(4) Current Ib of battery bank B
(5) Operating condition of current breaker 45 (whether or not being tripped)

The integrated monitoring unit 20 is connected with the individual monitoring units 50 of the battery banks B1 to B10 via signal lines, and is configured to receive, from the individual monitoring units 50 of the battery banks B1 to B10, data on the states of the battery banks B, that is, data on the items (1) to (5) described above.

The integrated monitoring unit 20 monitors the states of the battery banks B1 to B10 in accordance with the data on the items (1) to (5) received from the individual monitoring units 50 of the battery banks B1 to B10. The integrated monitoring unit 20 is also connected with a control unit 15 of the unmanned carrier 10 so as to be communicable with the control unit 15 of the unmanned carrier 10.

2. Abnormality Determination on Battery Bank B

In a case where part of the secondary batteries 33 of the battery bank B has abnormality such as an internal short-circuit or voltage variation outside a permissible range, the battery bank B needs to be disconnected from the power supply system U for security of the power supply system U.

The secondary battery 33 having an internal short-circuit or voltage variation outside the permissible range has decrease in voltage. The secondary battery 33 can be determined as being "abnormal" if minimum cell voltage Vmi of the secondary battery 33 of the battery bank B compared with a lower limit value X1 (at an application limit) becomes lower than the lower limit value X1, and the battery bank B including the secondary battery 33 determined as being abnormal is to be disconnected from the power supply system U.

The secondary batteries 33, however, have decrease in voltage (hereinafter, referred to as drop) due to internal resistance. Even in a case where the cell itself has no actual abnormality, the secondary batteries 33 of the battery bank B can entirely be decreased in cell voltage V by drop due to internal resistance during discharge and part of the secondary batteries 33 can have cell voltage lower than the lower limit value X1.

In view of this, the present embodiment includes determination on whether or not the battery bank B has abnormality according to average cell voltage Vav of all the secondary batteries 33 of the operating bank B and the minimum cell voltage Vmi of the secondary batteries 33 of the operating bank B.

Figure 5:
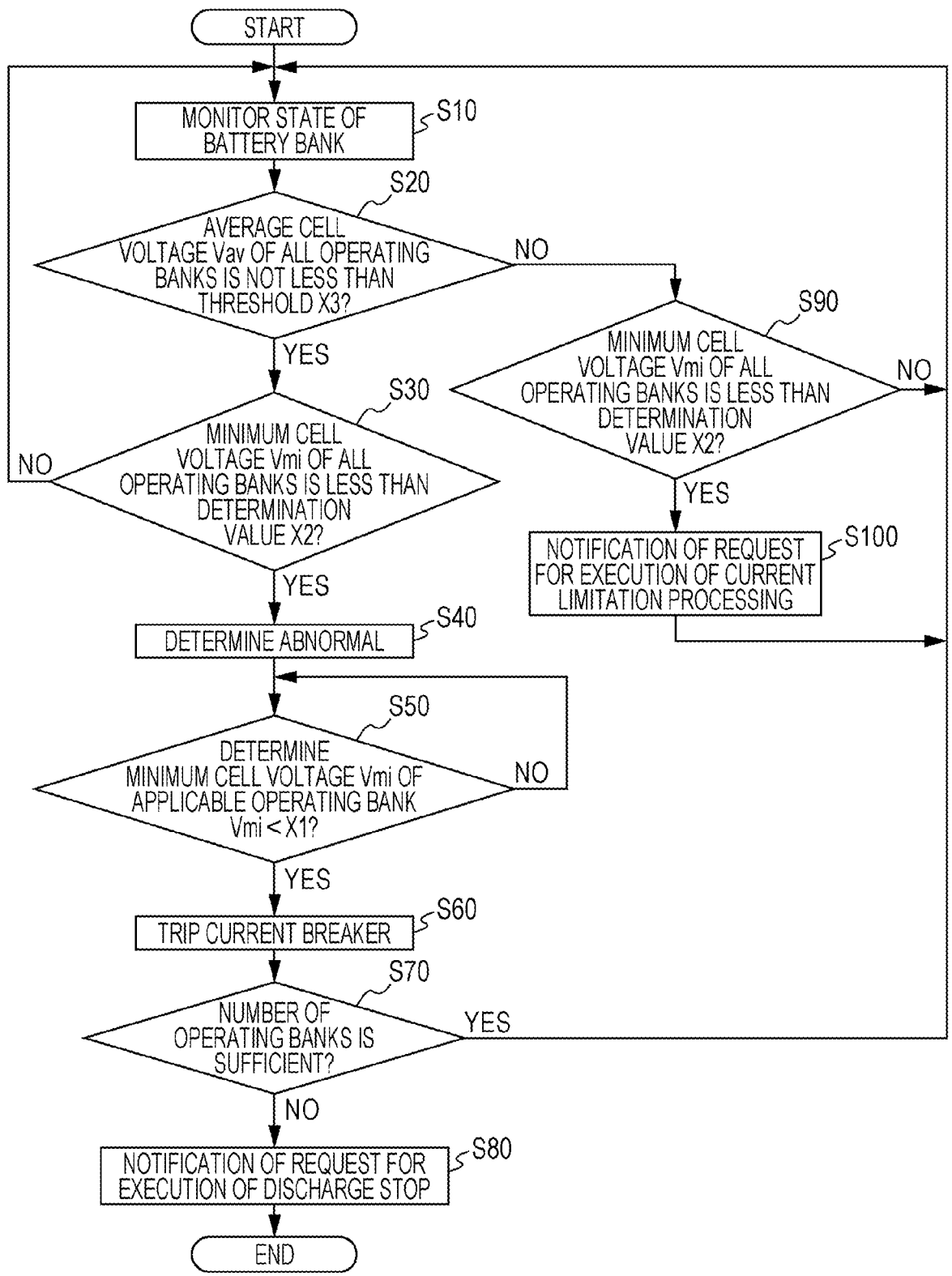
FIG. 5 is a flowchart depicting an abnormality determination flow.

Specifically, if the average cell voltage Vav of the secondary batteries 33 of all the operating banks B is not less than a threshold X3 (YES in S20 in FIG. 5) and the minimum cell voltage Vmi of the secondary batteries 33 of all the operating banks B is less than a determination value X2 that is smaller than the threshold X3 (S30 in FIG. 5), the integrated monitoring unit 20 determines that the operating banks B have abnormality (S40 in FIG. 5). In other words, the integrated monitoring unit 20 determines that part of the secondary batteries 33 of the operating banks B has abnormality. The words "operating bank" indicate the battery bank B including the current breaker 45 not being tripped and being capable of supplying power to the unmanned carrier 10 serving as a load.

Figure 3:
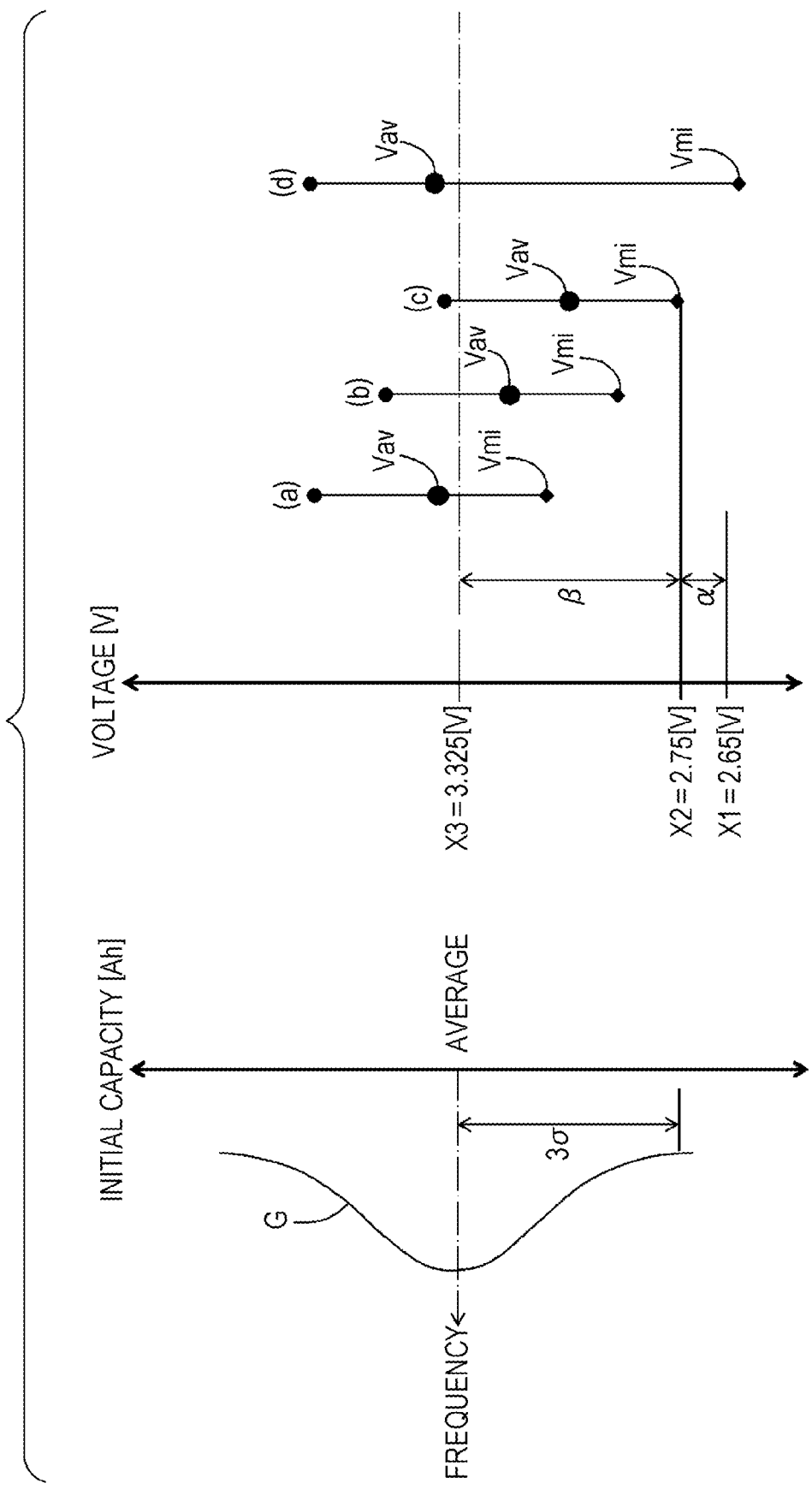
FIG. 3 is a view indicating relations among voltage, a lower limit value, a determination value, and a threshold of a secondary battery.

As indicated in FIG. 3, the determination value X2 is obtained by adding a predetermined margin (allowance) a to the lower limit value (an application limit value on a discharge side) X1 of the voltage of the secondary battery 33. The lower limit value X1 is 2.65 [V] and the margin is 0.10 [V] in the present example, so that the determination value X2 is 2.75 [V]. The threshold X3 is 3.325 [V] or the like, which is set to a numerical value obtained by adding permissible variation β of the voltage of the secondary battery 33 to the determination value X2.

The permissible range β of the voltage variation according to the present example is calculated in accordance with a permissible range of initial capacity variation of the secondary battery 33. Specifically, the initial capacity [Ah] of a predetermined number of secondary batteries 33 is actually measured to preliminarily calculate distribution of the initial capacity, and the permissible range of the initial capacity variation is set to 3σ thereof. FIG. 3 includes a curved line G indicating the initial capacity variation, and the symbol "σ" indicates a standard deviation. The value 3σ is merely exemplary, and can be different depending on variation in production of the adopted energy storage devices (the secondary batteries 33). An appropriate permissible range of the voltage variation is determined in accordance with the permissible range of capacity variation of the adopted energy storage devices.

The initial capacity variation is converted to a state of charge (SOC), and a permissible range Y (e.g. 5%) of SOC variation of the secondary battery 33. Further conversion is made in accordance with correlation between the SOC and the voltage (curved line L2 indicated in FIG. 4), to calculate the permissible range β of the voltage variation. The permissible range of the SOC variation is 5% and the permissible range β of the voltage variation is 0.575 V in the present example.

Figure 4:
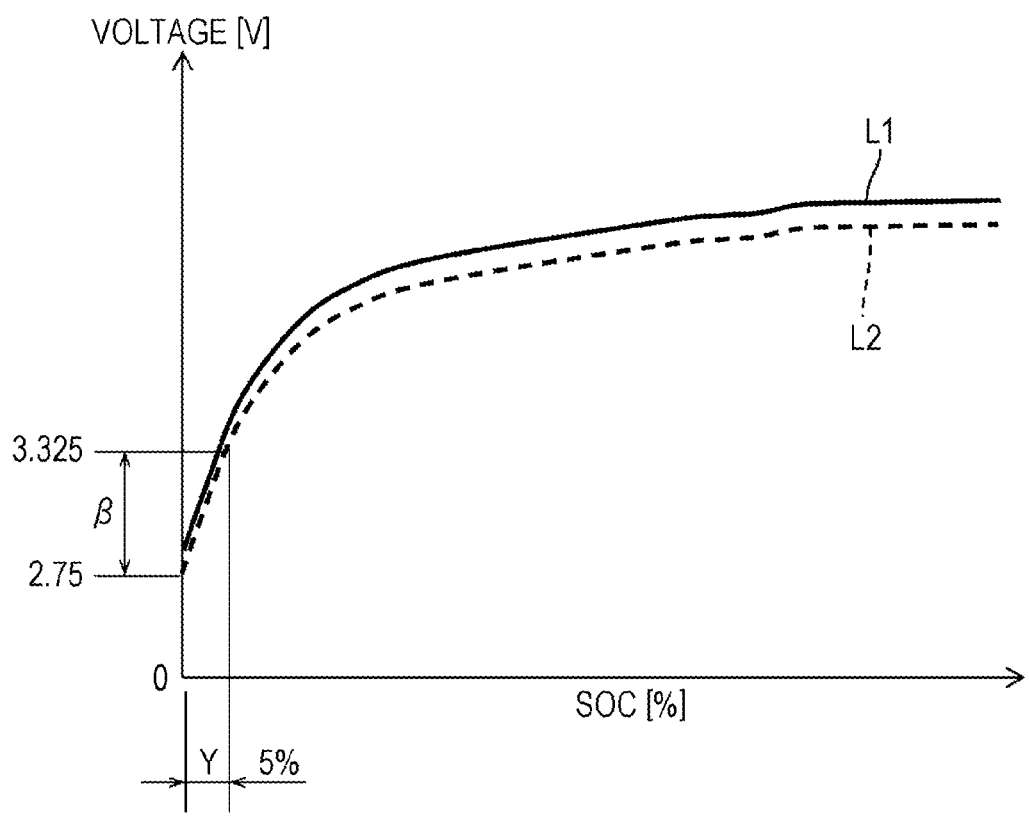
FIG. 4 is a graph indicating correlation between voltage and an SOC of the secondary battery.

FIG. 4 includes a solid curved line L1 indicating correlation between open circuit voltage and the SOC of the secondary battery 33, and the broken curved line L2 indicating correlation between the cell voltage V and the SOC of the secondary battery 33 discharging at a predetermined rate.

The threshold X3 is set to the numerical value obtained by adding the permissible range β of the voltage variation to the determination value X2. In a case where the operating bank B does not include the secondary battery 33 having voltage decreased to be out of the permissible range β, if the average cell voltage Vav of all the secondary batteries 33 in the operating bank B is higher than the threshold X3, the minimum cell voltage Vmi is higher than the determination value X2, as indicated by a line (a) in FIG. 3. The operating bank B can thus be determined as normal, in other words, not including any abnormal secondary battery 33.

In another case where the operating bank B includes the secondary battery 33 having voltage decreased to be out of the permissible range β or the secondary battery 33 having an internal short-circuit, as indicated by a line (d) in FIG. 3, the minimum cell voltage Vmi is lower than the determination value X2 even if the average cell voltage Vav of the secondary batteries 33 of all the operating banks B is higher than the threshold X3. The operating bank B is thus determined as having abnormality, in other words, including the abnormal secondary battery 33.

As indicated by lines (b) and (c) in FIG. 3, if the average cell voltage Vav of all the secondary batteries 33 of the operating bank B is lower than the threshold X3, whether or not the operating bank B has abnormality is not determined regardless of whether or not the minimum cell voltage Vmi is lower than the determination value X2.

Accordingly, abnormality determination is not made when all the secondary batteries 33 of the operating bank B have the cell voltage V entirely decreased by drop due to internal resistance. The operating bank B is thus not erroneously determined as being abnormal when all the secondary batteries 33 of the operating bank B have the cell voltage V entirely decreased to partially reach the determination value X2. This improves accuracy of abnormality determination on the operating bank B.

In the present embodiment, if the average cell voltage Vav of all the secondary batteries 33 of the operating bank B is less than the threshold X3 (No in S20 in FIG. 5) and the minimum cell voltage Vmi of the secondary batteries 33 of the operating bank B is less than the determination value X2 (YES in S90 in FIG. 5), the integrated monitoring unit 20 notifies to request the control unit 15 of the unmanned carrier 10 to execute current limitation processing of reducing current of the power supply system U (S100 in FIG. 5).

Specifically, the integrated monitoring unit 20 notifies to request the control unit 15 to slow down the driving unit 13. Upon receipt of the notification, the control unit 15 slows down the driving unit 13 to decrease discharge current Ib flowing from the power supply system U to the driving unit 13.

In this configuration, when the secondary batteries 33 of the battery bank B have voltage entirely decreased by drop due to internal resistance to partially reach the determination value X2, the discharge current Ib is reduced to decrease the drop of the secondary batteries 33 due to internal resistance. The minimum voltage Vmi of the secondary batteries 33 can thus be inhibited from becoming less than the determination value X2 as well as the lower limit value X1. The determination value X2 exemplifies the "switching voltage".

3. Abnormality Determination Flow

FIG. 5 is a flowchart depicting an abnormality determination flow of the power supply system U, and the abnormality determination flow is started after the power supply system U is activated. After the activation, each of the module sensors 35 in each of the battery banks B1 to B10 executes, periodically at a constant cycle, processing of detecting the cell voltage V of the secondary batteries 33 of the corresponding battery module 31, and processing of detecting the temperature T of the battery module 31. The current sensor 41 executes, periodically at a constant cycle, processing of detecting the current Ib flowing to/from the battery modules 31.

The individual monitoring unit 50 monitors the data on the items (1) to (4), namely, the cell voltage V of the secondary batteries 33 of the battery modules 31, the total voltage Vb of the battery bank B, the temperature T of the battery modules 31, and the current Ib of the battery bank B, in accordance with the data received from the module sensors 35 and the current sensor 41.

The data on the items (1) to (4) and the data on the item (5) of the operating condition of the current breaker 45 are periodically transmitted from the individual monitoring unit 50 of each of the battery banks B1 to B10 to the integrated monitoring unit 20, which also stores the data on the items (1) to (5).

The integrated monitoring unit 20 calculates the average cell voltage Vav of the secondary batteries 33 of all the operating banks B in accordance with the data on the cell voltage V of the secondary batteries 33 of the operating banks B. In a case where there are nine operating banks B1 to B9, the integrated monitoring unit 20 calculates the average cell voltage Vav of all the secondary batteries 33 of the nine operating banks B1 to B9. The integrated monitoring unit 20 then compares the average cell voltage Vav of the operating banks B1 to B9 with the threshold X3 (S20).

If the average cell voltage Vav of the operating banks B1 to B9 is not less than the threshold X3 (YES in S20), the integrated monitoring unit 20 calculates the minimum cell voltage Vmi or the lowest voltage of all the secondary batteries 33 of the operating banks B1 to B9.

The integrated monitoring unit 20 then compares the calculated minimum cell voltage Vmi with the determination value X2 (S30). In a case where the minimum cell voltage Vmi is not less than the determination value X2 (NO in S30), the integrated monitoring unit 20 determines that the operating banks B1 to B9 are normal, in other words, that the secondary batteries 33 of the operating banks B1 to B9 have no abnormality. In this case, the process flow returns to step S10.

In another case where the minimum cell voltage Vmi is less than the determination value X2 (YES in S30), the integrated monitoring unit 20 determines that the operating banks B1 to B9 have abnormality (S40). In other words, the integrated monitoring unit 20 determines that part of the operating banks B1 to B9 includes an abnormal secondary battery 33. The integrated monitoring unit 20 then notifies the applicable operating bank B of abnormality. The applicable operating bank B includes the secondary battery 33 having the minimum cell voltage Vmi less than the determination value X2 (the operating bank B1 in this case).

The individual monitoring unit 50 of the applicable operating bank B1 then compares the minimum cell voltage Vmi with the lower limit value X1 (S50).

The minimum cell voltage Vmi is kept monitored while the minimum cell voltage Vmi is larger than the lower limit value X1. If the minimum cell voltage Vmi becomes less than the lower limit value X1 (YES in S50), the individual monitoring unit 50 transmits a command to the current breaker 45 to trip the current breaker 45 (S60).

The operating bank B1 including the abnormal secondary battery 33 is accordingly disconnected from the power supply system U. After the operating bank B1 is disconnected, only the operating banks B2 to B9 determined as being normal continuously supply power to the unmanned carrier 10.

The integrated monitoring unit 20 constantly determines whether or not the number N of the currently operating banks is sufficient (S70). Specifically, the number N of the currently operating banks is more than "the minimum number of banks necessary for driving the unmanned carrier 10", the integrated monitoring unit 20 determines that the number of the operating banks is sufficient. In a case where the number N of the currently operating banks is "nine" and the minimum number of banks necessary for driving is "seven", the number N of the operating banks is larger than the minimum number of banks by two and the number N of the operating banks is determined as being sufficient.

In a case where the number N of the operating banks is determined as being sufficient (YES in S70), the process flow returns to step S10.

In the case where the number of the operating banks B is larger than the minimum number of banks (YES in S70), if part of the secondary batteries 33 has abnormality, the operating banks B2 to B9 including the abnormal secondary batteries 33 are to sequentially be disconnected from the power supply system U when the minimum cell voltage Vmi reaches the lower limit value X1. Alternatively, the operating bank B can be immediately disconnected when the minimum cell voltage Vmi becomes less than the determination value X2.

In another case where the number of the operating banks is not more than the minimum number of banks (NO in S70), disconnecting any additional operating bank B causes the number of the operating banks to be less than the minimum number of banks and power cannot continuously be supplied to the unmanned carrier 10.

In this case, the integrated monitoring unit 20 determines that discharge cannot be continuously executed, and notifies to request the control unit 15 of the unmanned carrier 10 to stop discharge, in other words, to stop the driving unit 13 (S80).

Described next is a case where the average cell voltage Vav of all the operating banks B is less than the threshold X3 (NO in S20). Assume that there are nine operating banks B1 to B9.

If the average cell voltage Vav of all the operating banks B1 to B9 is less than the threshold X3, the integrated monitoring unit 20 calculates the minimum cell voltage Vmi or the lowest voltage of all the secondary batteries 33 of all the operating banks B1 to B9, as in step S30. The integrated monitoring unit 20 then compares the calculated minimum cell voltage Vmi with the determination value X2 (S90).

In a case where the minimum cell voltage Vmi is not less than the determination value X2 (NO in S90), the process flow returns to step S10.

In another case where the minimum cell voltage Vmi of the operating banks B1 to B9 is less than the determination value X2 (YES in S90), the integrated monitoring unit 20 determines that the discharge current of the operating banks B1 to B9 needs to be limited, and notifies to request the control unit 15 of the unmanned carrier 10 to execute the current limitation processing. Specifically, the integrated monitoring unit 20 notifies to request the control unit 15 to slow down the driving unit 13 (S100).

The control unit 15 accordingly slows down the driving unit 13 so as to decrease the discharge current Ib flowing from the operating banks B1 to B9 to the driving unit 13. The secondary batteries 33 of the operating banks B1 to B9 thus have smaller drop (decrease in voltage) due to internal resistance. This inhibits the minimum cell voltage Vmi from becoming less than the determination value X2, in other words, reaching the lower limit value X1 at the application limit. The operating banks B1 to B9 can thus continuously supply power to the unmanned carrier 10 while tripping the current breakers 45 being inhibited.

4. Effects

In the power supply system U according to the present embodiment, whether or not the operating banks B1 to B9 have abnormality is determined in accordance with the two determination criteria of "the average cell voltage Vav of the secondary batteries 33" and the "minimum cell voltage Vmi of the secondary batteries 33". This improves determination accuracy in comparison to the case where determination is made only in accordance with the determination criterion of "the minimum cell voltage Vmi".

Specifically, the integrated monitoring unit 20 determines whether or not the operating bank B has abnormality in accordance with the minimum cell voltage Vmi of all the secondary batteries 33 of the operating bank B when the average cell voltage Vav of all the secondary batteries 33 of the operating bank B is not less than the threshold X3 (YES in S20).

If the average cell voltage Vav is not less than the threshold X3 and the minimum cell voltage Vmi is lower than an ordinary value, the operating bank B is likely to include an abnormal secondary battery 33. This enables accurate determination on whether or not the operating bank B has abnormality.

In the power supply system U according to the present embodiment, the operating bank B is determined as being abnormal if the minimum cell voltage Vmi is less than the determination value X2 (YES in S30). The determination value X2 is obtained by adding the predetermined margin to the lower limit value X1 of the secondary battery 33. This configuration thus achieves determination that the operating bank B has abnormality before the minimum cell voltage Vmi reaches the lower limit value X1.

In the power supply system U according to the present embodiment, whether or not the operating banks B1 to B9 need current limitation is determined in accordance with the two determination criteria of "the average cell voltage Vav of the secondary batteries 33" and the "minimum cell voltage Vmi of the secondary batteries 33". This improves determination accuracy in comparison to the case where determination is made only in accordance with the determination criterion of "the minimum cell voltage Vmi".

Specifically, whether or not current limitation is needed is determined in accordance with the minimum cell voltage Vmi of all the secondary batteries 33 of the operating bank B in the case where the average cell voltage Vav of all the secondary batteries 33 of the operating bank B is less than the threshold X3 (NO in S20).

When average cell voltage Vav is less than the threshold X3 and the minimum cell voltage Vmi is decreased (NO in S20), the operating bank B is less likely to be abnormal but the flowing discharge current is likely to exceed an appropriate value. This configuration thus achieves accurate determination on whether or not the discharge current needs to be limited.

When the minimum cell voltage Vmi is less than the determination value X2, the integrated monitoring unit 20 determines that the current needs to be limited and notifies to request the control unit 15 of the unmanned carrier 10 to slow down the driving unit 13. The control unit 15 then slows down the driving unit 13, and the secondary batteries 33 of the operating banks B1 to B9 thus have smaller drop (decrease in voltage) due to internal resistance. This inhibits the minimum cell voltage Vmi from becoming less than the determination value X2, in other words, reaching the lower limit value X1 at the application limit. The operating banks B1 to B9 can thus continuously supply power to the unmanned carrier 10 while tripping the current breakers 45 being inhibited.

<Second Embodiment>

The second embodiment of the present invention will now be described with reference to FIGS. 6 and 7.

In the first embodiment, the operating banks B are determined as having abnormality in the case where the average cell voltage Vav of all the secondary batteries 33 of the operating banks B1 to B9 is not less than the threshold X3 (YES in S20 in FIG. 5) and the minimum cell voltage Vmi of the secondary batteries 33 of the operating banks B1 to B9 is less than the determination value X2 (YES in S30 in FIG. 5). In other words, part of the operating banks B includes an abnormal secondary battery 33.

Furthermore, the operating banks B1 to B9 are determined as needing current limitation in the case where the average cell voltage Vav of all the secondary batteries 33 of the operating banks B1 to B9 is less than the threshold X3 (NO in S20 in FIG. 5) and the minimum cell voltage Vmi of the secondary batteries 33 of the operating banks B1 to B9 is less than the determination value X2 (YES in S90 in FIG. 5).

The voltage V and the SOC of the secondary battery 33 has a unique correspondence relation, and certain voltage V corresponds to a single SOC value.

Determination similar to that in step S20 can be executed in accordance with an average SOC of the secondary batteries 33 in place of the average cell voltage Vav of the secondary batteries 33.

Specifically, the individual monitoring unit 50 of each of the operating banks B1 to B9 according to the second embodiment calculates, after the start of monitoring the state of the battery bank B (from S10), the SOC of each of the secondary batteries 33 in accordance with the current integration method or the like and further calculates the average SOC of the secondary batteries 33. The average SOC is calculated at a predetermined cycle and is updated to the latest value.

The individual monitoring unit 50 of each of the operating banks B1 to B9 periodically transmits, to the integrated monitoring unit 20, data on the SOC of each of the secondary batteries 33 and the average SOC of the secondary batteries 33. The integrated monitoring unit 20 periodically calculates the average SOC of the secondary batteries 33 of all the operating banks B1 to B9.

Figure 6:
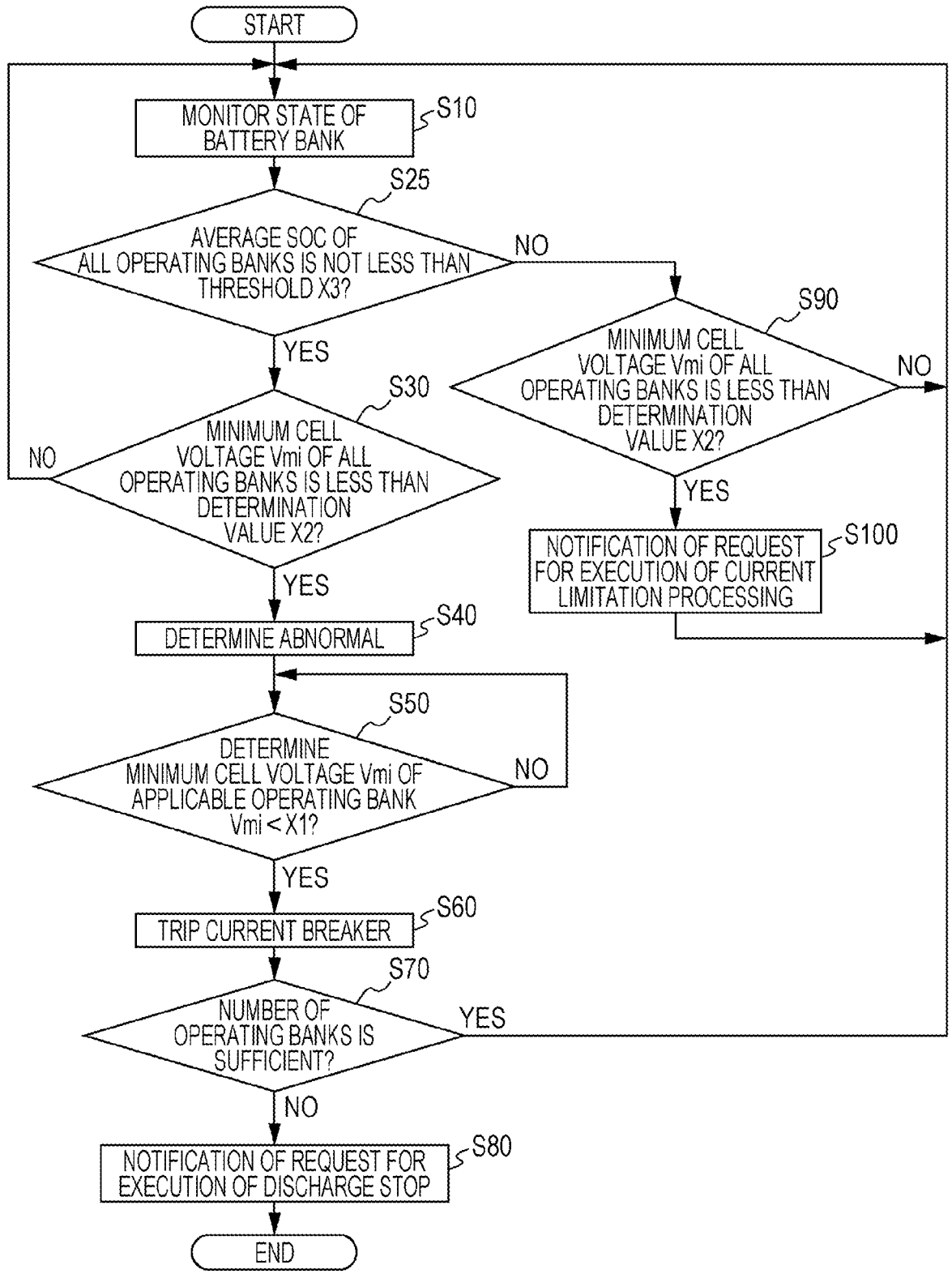
FIG. 6 is a flowchart depicting an abnormality determination flow according to a second embodiment.

The integrated monitoring unit 20 then compares the average SOC of the secondary batteries 33 of all the operating banks B1 to B9 with the threshold X3 (S25 in FIG. 6).

Figure 7:
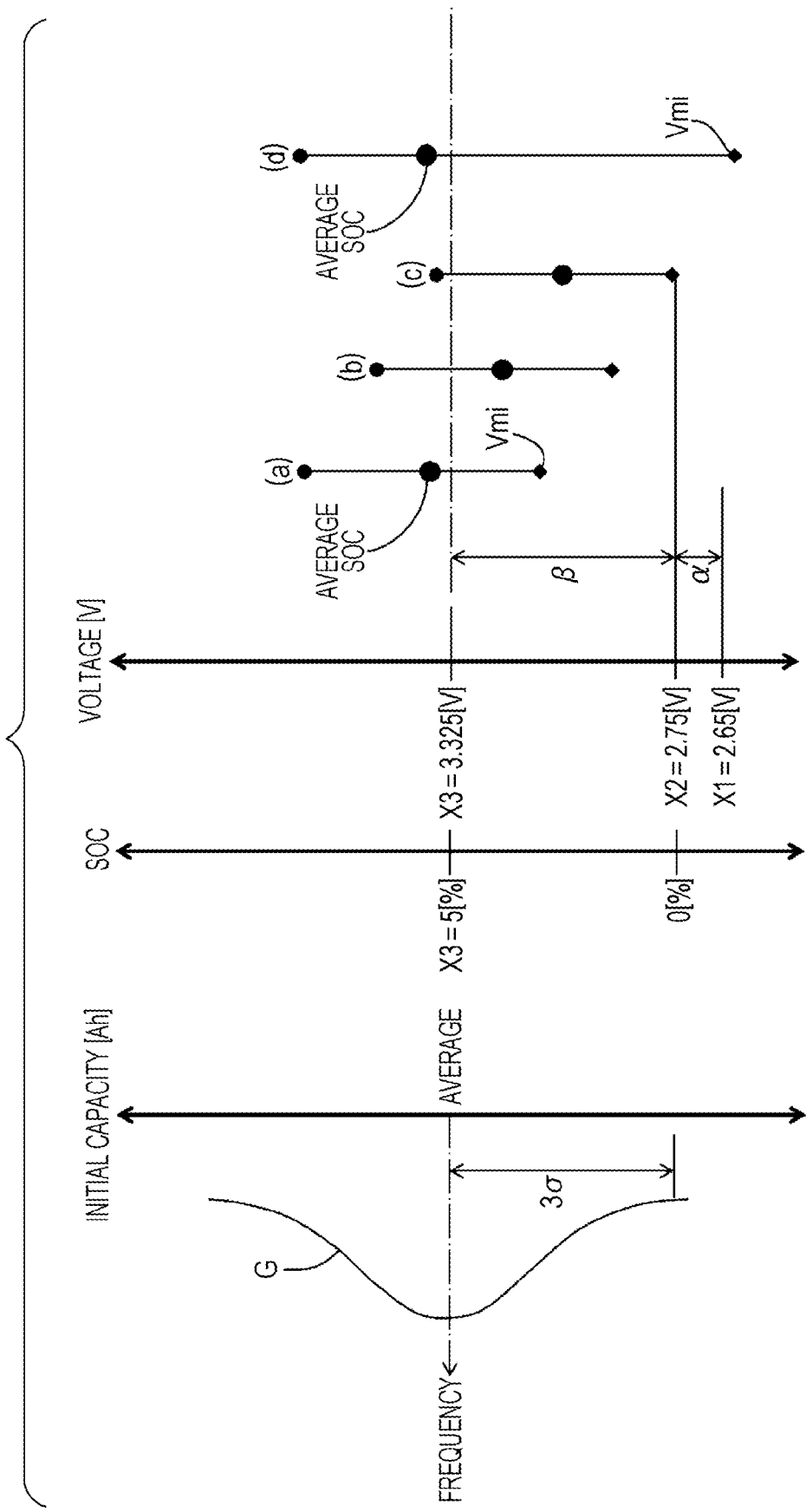
FIG. 7 is a view indicating relations among voltage, an SOC, a lower limit value, a switching value, and a threshold of a secondary battery.

As indicated in FIG. 7, the determination value X2 is 2.75 [V] and the SOC corresponding thereto is 0 [%]. The threshold X3 of the average SOC is 5 [%] in the present example, because the permissible variation 3σ in initial capacity of the adopted energy storage device (secondary battery 33) is exemplarily converted to SOC permissible variation of about 5%.

If the average SOC is larger than 5 [%] as the threshold X3, the integrated monitoring unit 20 compares the minimum voltage Vmi of the secondary batteries 33 of all the operating banks B1 to B9 with the determination value X2.

In the case where the minimum voltage Vmi is less than the determination value X2 (YES in S30 in FIG. 6), the integrated monitoring unit 20 determines that the operating banks B1 to B9 have abnormality (S40 in FIG. 6). In other words, the integrated monitoring unit 20 determines that part of the operating banks B1 to B9 includes an abnormal secondary battery 33.

In the second embodiment, whether or not the battery banks B1 to B9 have abnormality is determined in accordance with the average SOC of the secondary batteries 33 of all the operating banks B1 to B9 and the minimum cell voltage Vmi of the secondary batteries 33 of all the operating banks B1 to B9.

Similarly to the first embodiment, whether or not the operating banks B have abnormality can be determined more accurately in comparison to the case of determining whether or not the operating banks B have abnormality only in accordance with the determination criterion of the minimum voltage Vmi of the secondary batteries 33.

Although not described in detail, the second embodiment also includes processing of transmitting a command to the current breaker 45 to trip the current breaker 45 if the operating banks B are determined as having abnormality and the applicable operating bank B has the minimum cell voltage Vmi reaching the lower limit value X1. The operating bank B determined as having abnormality is then disconnected from the power supply system U.

When the average SOC of all the operating banks B1 to B9 is less than the threshold X3 (NO in S25 in FIG. 6) and the minimum cell voltage Vmi of the secondary batteries 33 of all the operating banks B1 to B9 is less than the determination value X2 (YES in S90 in FIG. 6), the integrated monitoring unit 20 notifies to request the control unit 15 of the unmanned carrier 10 to slow down the driving unit 13.

Similarly to the first embodiment, the control unit 15 then controls to slow down the driving unit 13. This inhibits the voltage of the secondary batteries 33 of the operating banks B1 to B9 from becoming lower than the determination value X2.

<Other Embodiments>

The present invention should not be limited to the embodiments described above with reference to the drawings, but the following embodiments should be included in the technical scope of the present invention.

(1) The first embodiment exemplifies the case where the power supply system U is applied to the power supply of the unmanned carrier 10. The power supply system U is not limitedly applied to the unmanned carrier 10 but can be applied to a different apparatus such as an uninterruptible power system (UPS).

(2) The energy storage device according to the first embodiment is exemplified by the lithium ion secondary battery 33. Other examples of the energy storage device include a different secondary battery such as a lead-acid battery, and a capacitor.

(3) The current breaker 45 according to the first embodiment is exemplified by the molded case circuit breaker (MCCB). Other examples of the current breaker 45 include a relay.

(4) The first embodiment exemplifies calculating the permissible range of the voltage variation of the secondary battery 33 in accordance with the permissible range of the initial capacity variation of the secondary battery 33. The permissible range of the voltage variation of the secondary battery 33 can alternatively be calculated in accordance with the permissible range of the initial capacity variation and a permissible range of capacity variation due to deterioration, or can be set to an appropriate value.

(5) In the first embodiment, the integrated monitoring unit 20 obtains the average cell voltage Vav of all the secondary batteries 33 of the operating banks B1 to B9 and compares the obtained average cell voltage Vav with the threshold X3 (S20). The integrated monitoring unit 20 also obtains the minimum cell voltage Vmi of all the secondary batteries 33 of the operating banks B1 to B9, and compares the obtained minimum cell voltage Vmi with the determination value X2 to determine whether or not the operating banks B1 to B9 have abnormality (S30). The processing in steps S20 and S30 can alternatively be executed for each of the operating banks to determine whether or not each of the operating banks B1 to B9 has abnormality. In this case, the processing in steps S20 and S30 can be executed by the individual monitoring unit 50 of each of the operating banks B1 to B9.

(6) The determination value X2 according to the first embodiment is obtained by adding the predetermined margin a to the lower limit value X1. The determination value can alternatively be set equal to the lower limit value X1. In this case, the permissible range β of the voltage variation of the secondary battery 33 can be set to a difference between the lower limit value X1 and the threshold X3.

(7) The first embodiment includes notifying to request execution of the current limitation processing if the minimum cell voltage Vmi is less than the determination value X2 (YES in S90). Voltage to be compared with the minimum cell voltage Vmi (i.e. the "switching voltage" according to the present invention) for determination on whether or not to request execution of the current limitation processing has only to be smaller than the threshold X3 and larger than the lower limit value X1, and can be different from the determination value X2.

(8) The power supply system U according to the first embodiment is exemplarily configured by the ten battery banks B1 to B10 connected parallelly. The number of the parallelly connected battery banks B is not limited to ten, but a different number of battery banks can alternatively be connected parallelly.

Figure 8:
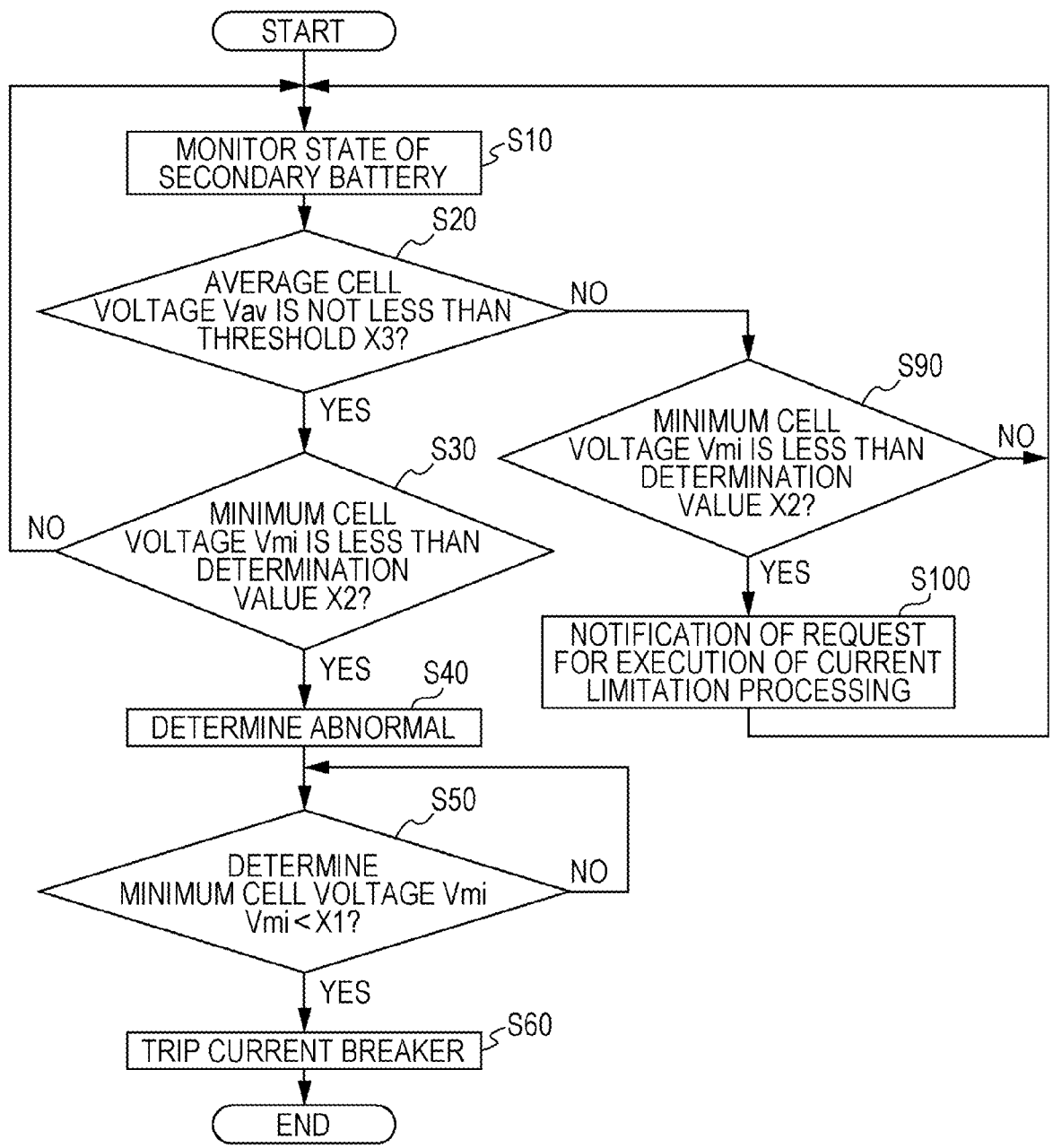
FIG. 8 is a flowchart depicting an abnormality determination flow according to another embodiment.

(9) The power supply system U is not necessarily configured by a plurality of battery banks B, but can alternatively be of a standalone type including a single battery bank B. As depicted in FIG. 8, if the average cell voltage Vav of the secondary batteries 33 of the single battery bank B is not less than the threshold X3 (YES in S20) and the minimum cell voltage Vmi of the secondary batteries 33 of the single battery bank B is less than the determination value X2 (YES in S30), the monitoring unit 50 of the battery bank B determines that the battery bank B includes an abnormal secondary battery 33 (S40).

If the battery bank B is determined as having abnormality (S40), the processing of determining the minimum cell voltage Vmi is executed (S50). When the minimum cell voltage Vmi becomes lower than the lower limit value X1, the monitoring unit 50 executes the processing of tripping the current breaker 45 (S60).

In the case where the average cell voltage Vav of the secondary batteries 33 of the single battery bank B is less than the threshold X3 (NO in S20) and the minimum cell voltage Vmi of the secondary batteries 33 of the single battery bank B is less than the determination value X2 (YES in S90), the battery bank B is determined as needing current limitation and the monitoring unit 20 notifies to request the control unit 15 of the unmanned carrier 10 to execute the current limitation processing. The power supply system U configured by the single battery bank B, needs neither the processing of determining the number of the operating banks (S70 in FIG. 5) nor the processing of requesting execution of discharge stop (S80 in FIG. 5).

The integrated monitoring unit 20 according to the first embodiment executes determination according to the average cell voltage or the average SOC of all the operating banks and the minimum cell voltage Vmi, and notifies to request execution of the current limitation processing or discharge stop. The control unit 15 can alternatively execute similar processing in accordance with the parameters externally transmitted from the integrated monitoring unit 20. The individual monitoring unit trips the current breaker also in this case.

The first embodiment includes two cases (a) and (b) of determination on the power supply system U according to "the average cell voltage Vav of all the secondary batteries 33 of the operating banks B1 to B9" and "the minimum cell voltage Vmi of all the secondary batteries 33 of the operating banks B1 to B9".

The present technique is widely applicable to determination on the state of the power supply system U in accordance with "the average cell voltage (or the average SOC) of the secondary batteries 33" and "the minimum cell voltage of the secondary batteries 33". The present technique is alternatively applied to determination on a state other than the cases (a) and (b). The same applies to the power supply system U of the standalone type including the single battery bank B.

(a) Determine whether or not the operating banks B1 to B9 have abnormality as exemplary determination on the state of the power supply system U (b) Determine whether or not the operating banks B1 to B9 need the current limitation processing as exemplary determination on the state of the power supply system U The first embodiment includes comparing the average cell voltage Vav of the secondary batteries 33 of all the operating banks B with the threshold X3 in step S20 in FIG. 5, and determining as YES to proceed to the processing in step S30 if the average cell voltage Vav is not less than the threshold X3 or determining as NO to proceed to the processing in step S90 if the average cell voltage Vav is less than the threshold X3. The process flow proceeds to step S30 if the average cell voltage Vav is equal to the threshold X3 in the above example. Similar effects can be achieved even when the process flow proceeds to step S90. Accordingly, determination can be made as YES to proceed to the processing in step S30 if the average cell voltage Vav is larger than the threshold X3 and determination can be made as NO to proceed to the processing in step S90 if the average cell voltage Vav is not more than the threshold X3. The same applies to the processing in steps S30, S50, and S90.

What is claimed is:

1. An energy storage apparatus comprising:
    a plurality of energy storage devices connected in series;
    a voltage detection unit configured to detect voltage of each of the energy storage devices; and
    a monitoring unit configured to monitor the plurality of energy storage devices,
    wherein the monitoring unit determines a state of the energy storage apparatus in accordance with either average cell voltage or an average SOC of the plurality of energy storage devices, and minimum cell voltage of the plurality of energy storage devices.

2. The energy storage apparatus according to claim 1, wherein
    the monitoring unit determines whether or not the energy storage apparatus has abnormality in accordance with the minimum cell voltage of the plurality of energy storage devices when the average cell voltage or the average SOC of the plurality of energy storage devices is not less than a threshold.

3. The energy storage apparatus according to claim 2, wherein
the monitoring unit compares the minimum cell voltage of the plurality of energy storage devices with a determination value smaller than the threshold when the average cell voltage or the average SOC of the plurality of energy storage devices is not less than the threshold, and
determines that the energy storage apparatus has abnormality when the minimum cell voltage is less than the determination value.

4. The energy storage apparatus according to claim 3, wherein
the threshold and the determination value have a difference therebetween set in accordance with a permissible range of voltage variation of the energy storage device.

5. The energy storage apparatus according to claim 3, wherein
the determination value is obtained by adding a predetermined margin to a lower limit value of cell voltage of the energy storage device.

6. The energy storage apparatus according to claim 2, further comprising:
a current breaker connected to the plurality of the energy storage devices in series configured to break current flowing through the plurality of energy storage devices,
wherein the monitoring unit breaks the current breaker when the monitoring unit determines that the energy storage apparatus has abnormality.

7. The energy storage apparatus according to claim 1, wherein
the monitoring unit determines whether or not to limit discharge current of the energy storage apparatus in accordance with the minimum cell voltage of the plurality of energy storage devices when the average cell voltage or the average SOC of the plurality of energy storage devices is less than the threshold.

8. The energy storage apparatus according to claim 7, wherein
the monitoring unit compares the minimum cell voltage of the plurality of energy storage devices with switching voltage higher than the lower limit value when the average cell voltage or the average SOC of the plurality of energy storage devices is less than the threshold, and
determines that the discharge current of the energy storage apparatus needs to be limited when the minimum cell voltage is not more than the switching voltage and notifies to request a power supply target instrument to execute current limitation processing of limiting the discharge current.

9. A multibank energy storage system including the energy storage apparatuses according to claim 1, the plurality of energy storage apparatuses being connected parallelly, the energy storage system comprising:
the plurality of energy storage apparatuses connected parallelly; and
an integrated monitoring unit configured to monitor the plurality of energy storage apparatuses,
wherein the integrated monitoring unit determines a state of the energy storage system in accordance with either the average cell voltage or the average SOC of the energy storage devices of the energy storage system, and the minimum cell voltage of the energy storage devices of the energy storage system.

10. The energy storage system according to claim 9, wherein
the plurality of energy storage apparatuses of the energy storage system each include a current breaker configured to break current flowing through the plurality of energy storage devices,
the integrated monitoring unit determines whether or not the plurality of energy storage apparatuses has abnormality in accordance with the minimum cell voltage of the energy storage devices of the energy storage system when the average cell voltage of the energy storage devices of the energy storage system is not less than the threshold or when the average SOC of the energy storage devices of the energy storage system is not less than the threshold, and
when the integrated monitoring unit determines that the energy storage apparatuses have abnormality, the energy storage apparatus including the energy storage device causing abnormality determination breaks the current breaker to be disconnected from the remaining energy storage apparatuses.

11. The energy storage system according to claim 9, wherein
the integrated monitoring unit determines whether or not to limit the discharge current of the energy storage system in accordance with the minimum cell voltage of the energy storage devices of the energy storage system when the average cell voltage of the energy storage devices of the energy storage system is less than the threshold or when the average SOC of the energy storage devices of the energy storage system is less than the threshold, and
when the integrated monitoring unit determines that the discharge current of the energy storage system needs to be limited, the integrated monitoring unit notifies to request the power supply target instrument to execute the current limitation processing of limiting the discharge current.

12. A method of determining a state of an energy storage apparatus,
the energy storage apparatus including a plurality of energy storage devices connected in series,
the method comprising determining the state of the energy storage apparatus in accordance with either average cell voltage or an average SOC of the plurality of energy storage devices, and minimum cell voltage of the plurality of energy storage devices.

13. An energy storage apparatus comprising:
a plurality of energy storage devices connected in series;
a voltage detection unit configured to detect voltage of each of the energy storage devices; and
a monitoring unit configured to monitor the plurality of energy storage devices, wherein the monitoring unit determines a state of the energy storage apparatus in accordance with an average SOC of the plurality of energy storage devices and minimum cell voltage of the plurality of energy storage devices.

14. The energy storage apparatus according to claim 1, wherein the monitoring unit determines a state of the energy storage apparatus in accordance with the minimum cell voltage of each of the plurality of energy storage devices that is determined.

* * * * *